(12) United States Patent
Tang

(10) Patent No.: US 6,598,203 B1
(45) Date of Patent: Jul. 22, 2003

(54) PARALLEL PUNCTURED CONVOLUTIONAL ENCODER

(75) Inventor: Benjamin Tang, Hawthorne, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 455 days.

(21) Appl. No.: 09/605,470

(22) Filed: Jun. 28, 2000

(51) Int. Cl.[7] ............................... G06F 11/10
(52) U.S. Cl. .............. 714/790; 714/784; 714/781; 714/786
(58) Field of Search ................. 714/790, 786, 714/781, 746, 784, 755

(56) References Cited

U.S. PATENT DOCUMENTS

| | | | |
|---|---|---|---|
| 4,462,101 A | | 7/1984 | Yasuda et al. |
| 4,597,090 A | | 6/1986 | Forney, Jr. |
| 4,980,897 A | | 12/1990 | Decker et al. |
| 5,029,185 A | | 7/1991 | Wei |
| 5,233,629 A | | 8/1993 | Paik et al. |
| 5,307,377 A | * | 4/1994 | Chouly et al. |
| 5,396,518 A | * | 3/1995 | How |
| 5,633,881 A | | 5/1997 | Zehavi et al. |

* cited by examiner

*Primary Examiner*—Phung M. Chung
(74) *Attorney, Agent, or Firm*—John A. Miller; Warn, Burgess & Hoffmann, P.C.

(57) ABSTRACT

A parallel punctured convolutional encoder (44) that provides convolutional coding of a stream of digital data bits in a parallel manner for high frequency transmission. The parallel convolutional encoder (44) includes a plurality of one-bit delay devices (46–56) and four XOR gates (78–84). Three consecutive bits are applied to the convolutional encoder (44) in a parallel manner and four polynomial expressions are provided from the XOR gates 78–84 in a parallel manner at each clock cycle, where certain values in the polynomial expressions are provided and certain values are not provided to conform with a particular puncture scheme of a desirable convolutional rate. In an altnerate embodiment, a concatenated Reed-Solomon TCM QAM encoder is provided that operates on parallel lines of digital data for high frequency communications systems.

24 Claims, 4 Drawing Sheets

PARALLEL PUNCTURED CONVOLUTIONAL ENCODER

BACKGROUND OF THE INVENTION

1. Field of the Invention

This invention relates generally to a punctured convolutional encoder and, more particularly, to a parallel punctured convolutional encoder for providing bit error correction at high frequencies.

2. Discussion of the Related Art

Various communications systems, such as satellite communications systems, cellular telephone communications systems, etc., transmit digital data over a communications channel, such as a wireless data link, where the digital data is modulated onto a carrier wave. Typically, the transmission of digital data over the communications channel is corrupted by noise in varying degrees which causes bit errors. Thus, bit error control coding is often employed to protect the digital data from errors during transmission. Certain encoding schemes transmit redundant bits or bit symbols, to provide the bit error control. Convolutional coding is a well known bit error control coding technique for providing redundancy for bit error correction. Convolutional encoding includes mapping the bits into coded patterns without the need to partition the bits into blocks, where the bits are combined with message bits from the digital data. Punctured convolutional coding (PCC) is a known method of convolutional coding where selected bits or bit symbols are not transmitted to reduce bandwith requirements.

FIG. 1 is a schematic type diagram of a well known serial punctured convolutional encoder 10 that provides convolutional coding of the type referred to above. A stream of digital data bits x(n), where n=0, 1, 2 . . . . , to be transmitted is sent to the encoder 10 to be convolutionally coded. The encoder 10 generates two polynomial expressions $y_1(n)$ and $y_2(n)$ from the input bits that represent the bit pattern transmitted on the communications channel that is deciphered by a decoder (not shown) in the receiver to recreate the bit stream. The polynomial expressions are mathematically selected based on the largest distance between codewords in the bit stream. The decoder is typically a Viterbi decoder that receives the polynomial expressions $y_1(n)$ and $y_2(n)$, and gives the best possible sequence of the input bits x(n), as is well understood in the art. The transmission of $y_1(n)$ and $y_2(n)$ provides the redundancy of bit patterns to determine the input bit stream x(n).

The encoder 10 includes a series of one-bit delay devices 12–22, and two exclusive-OR (XOR) logic gates 24 and 26. Each of the delay devices 12–22 delay the particular data bit x(n) one clock period. Therefore, the current bit n is provided at node 28, the bit n−1 is provided at node 30, the bit n−2 is provided at node 32, the bit n−3 is provided at node 34, the bit n−5 is provided at node 36, and the bit n−6 is provided at node 38 for each clock cycle. The bits n, n−1, n−2, n−3, and n−6 are applied to the XOR gate 24, and the bits n, n−2, n−3, n−5 and n−6 are applied to the XOR gate 26. The polynomial expression $y_1(n)=x(n)+x(n−1)+x(n−2)+x(n−3)+x(n−6)$ is generated at the output of the gate 24, and the polynomial expression $y_2(n)=x(n)+x(n−1)+x(n−2)+x(n−3)+x(n−5)+x(n−6)$ is generated at the output of the gate 26. A switch 40 connects the output $y_1(n)$ from the gate 24 to the communications channel, and a switch 42 connects the output $y_2(n)$ from the gate 26 to the communications channel so that selectively activating the switches 40 and 42 causes the transmission of the bit patterns to be punctured in a desired manner.

For this punctured convolutional code, the rate is 314, which means that for every three bits that are input into the encoder 10, four bit symbols are output from the encoder 10. The convolutional rate is the fraction of the digits in the codeword that are necessary to represent the desired information. The remaining fraction, here 1/4, represents the redundancy that can be used to detect and correct errors. Further, in this example, the constraint length k is seven, which represents the number of delay taps in the encoder 10. Also, the polynomials used are $g_1$ equal to 171 in octal which is 001 111001, and $g_2$ equal to 133 in octal which is 001011011. The puncture pattern $u_1$ for the switch 40 is 110 and the puncture pattern $u_2$ for the switch 42 is 101, which continuously repeat. This puncture pattern establishes that polynomials $y_1(n)$ and $y_1(n+1)$ are transmitted, $y_1(n+2)$ is not transmitted, $y_2(n)$ is transmitted, $y_2(n+1)$ is not transmitted, $y_2(n+2)$ is transmitted, and so forth as the puncture pattern repeats. Thus, for every three input bits, four output bits or bit symbols are transmitted represented by the polynomial expression to give the 3/4 rate. The rate 3/4 code can be decoded by the available rate 1/2 decoders, which is the industry standard decoder.

The above described serial punctured convolutional code scheme is well known, and operates effectively in wireless transmission schemes. However, the known convolutional encoding for bit error correction is limited in frequency. Particularly, as the frequency of the bit rate increases, it becomes more important that the bit transmission is not bursty, and the bits keep coming without punctures. It is therefore an object of the present invention to convert the known serial punctured convolutional code scheme described above to a parallel implementation applicable for higher frequency communications without bursty data.

SUMMARY OF THE INVENTION

In accordance with the teachings of the present invention, a parallel punctured convolutional encoder is disclosed that provides convolutional coding of a stream of digital data bits in a parallel manner for high frequency transmission. The parallel convolutional encoder includes a plurality of one-bit delay devices and four XOR gates. Three consecutive bits are applied to the convolutional encoder in a parallel manner at each clock cycle, and four polynomial expressions are provided from the XOR gates in a parallel manner for each clock cycle, where certain values in the polynomial expressions are provided and certain values are not provided to conform with a particular puncture scheme of a desirable convolutional rate.

In an alternate embodiment, a concatenated Reed-Solomon TCM QAM encoder is provided that inputs a series of parallel data bits at a high frequency clock rate, and outputs a certain number of parallel output bits at another high frequency clock rate. The input bit lines and the output bit lines are selected based on the rate of a trellis code modulator within the encoder. In this embodiment, a plurality of rate buffers allow the input data to be written into the buffer in a continuous matter at an input clock, and read out at a higher frequency output clock that is gated so that the number of output clock edges equal the number of input clock edges over a certain period of inputs. A plurality of Reed-Solomon encoders map a block of 7-bit input symbols into another block of 7-bit symbols consisting of a certain input word filled by a certain number of 7-bit parity symbols. A commutator maps the 7-bit input symbols into 7-bit output symbols in a periodic scheme so that for any given period of 48 consecutive inputs, each of the 48 input symbols gets mapped only once for each output symbol. A trellis code modulator maps the 7-bit input symbol into two 4-bit output symbols using a rate 3/4 convolutional encoder, where the 4-bit symbols consist of two uncoded bits and two coded bits.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments directed to a parallel punctured convolutional encoder and a parallel TCM QAM encoder is merely exemplary in nature, and is in no way intended to limit the invention or its applications or uses.

Figure 1:
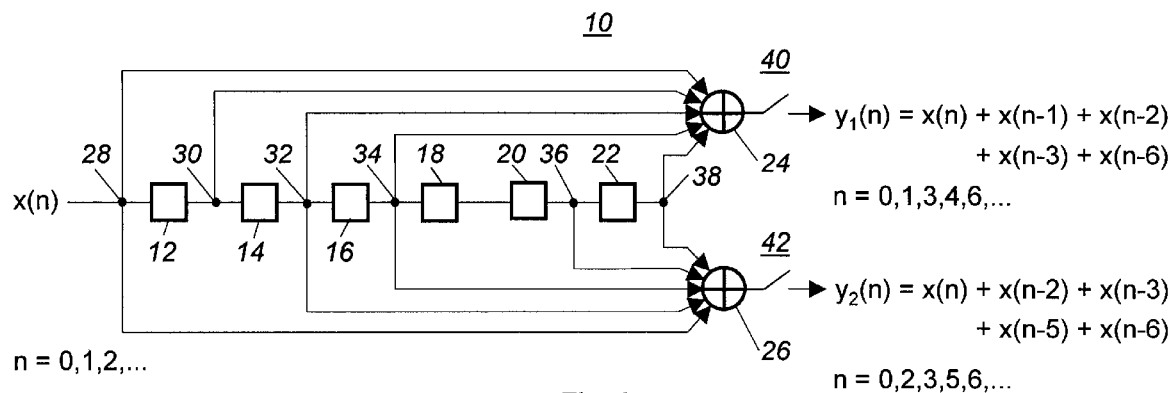
FIG. 1 is a schematic-type diagram of a known serial punctured convolutional encode.
Figure 2:
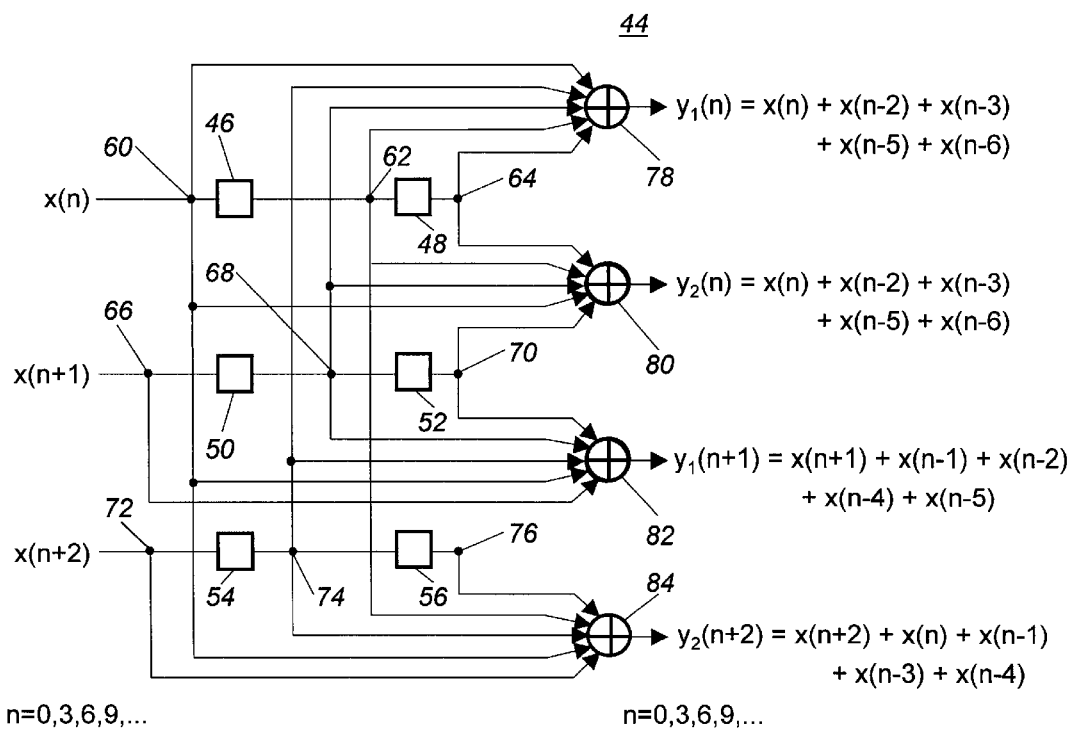
FIG. 2 is a schematic-type diagram of a parallel punctured convolutional encoder, according to an embodiment of the present invention.

FIG. 2 is a schematic-type diagram of a parallel punctured convolutional encoder 44 that is mathematically equivalent to the encoder 10 in that it provides the same punctured encoded bits or bit symbols as the encoder 10, but does not include switches that cause bursty data. The encoder 44 would be used in a digital data transmitter of the type typically employed in various telecommunications and satellite communications systems, as would be well understood to those skilled in the art, and has a particular use for high frequency communication systems. The encoder 44 receives three consecutive input bits $x(n)$, $x(n+1)$ and $x(n+2)$ in a parallel manner for each clock cycle, and outputs four bit symbols, represented by the polynomial expressions $y_1(n)$, $y_2(n)$, $y_1(n+1)$ and $y_2(n+2)$, to provide the punctured code at the desirable 3/4 convolutional rate.

The encoder 44 includes a series of six one-bit delay devices 46–56, configured as shown, that delay the input bit one clock cycle. A serial to parallel converter (not shown) is provided that takes each series of three consecutive bits as a serial input and outputs the bits as three parallel bits, here bits $x(n)$, $x(n+1)$ and $x(n+2)$, for each clock cycle. Therefore, for each clock cycle, the current bit n is provided at node 60, the bit n–3 is provided at node 62, the bit n–6 is provided at node 64, the bit n+1 is provided at node 66, the bit n–2 is provided at node 68, the bit n–5 is provided at node 70, the bit n+2 is provided at node 72, the bit n–1 is provided at node 74, and the bit n–4 is provided at node 76. At the next clock cycle, the bits $x(n+3)$, $x(n+4)$ and $x(n+5)$ are provided as the three parallel input bits to the encoder 44, and the bits at the nodes 60–76 advance by three bits accordingly.

The bits from nodes 60, 74, 68, 62 and 64 are applied to an XOR gate 78, that outputs the polynomial expression $y_1(n)=x(n)+x(n-1)+x(n-2)+x(n-3)+x(n-6)$ as a first bit symbol. The bits from nodes 64, 62, 68, 60 and 70 are applied to an XOR gate 80, that outputs the polynomial expression $y_2(n)=x(n)+x(n-1)+x(n-2)+x(n-3)+x(n-5)+x(n-6)$ as a second bit symbol. The bits at nodes 60, 68, 74, 60 and 66 are applied to an XOR gate 82, that outputs the polynomial expression $y_1(n+1)=x(n+1)+x(n)+x(n-1)+x(n-2)+x(n-5)$ as a third bit symbol. The bits from nodes 76, 62, 74, 60, and 66 are applied to an XOR gate 84, that outputs the polynomial expression $y_2(n+2)=x(n+2)+x(n)+x(n-1)+x(n-3)+x(n-4)$ as a fourth bit symbol. At the next clock cycle, $y_1(n+3)$, $y_2(n+3)$, $y_1(n+4)$ and $y_2(n+5)$ are generated. Thus, at any given clock, there are four bit symbols representing the three input bits to give the 3/4 rate. A parallel-to-series converter (not shown) would be provided to take the bit symbols from the XOR gates 78–84 and convert them back into a serial stream.

The puncture code discussed above for this type of an encoder, where $u_1$ is 110 and $u_2$ is 101, is such that $y_1(n)$ is provided as an output of the encoder 44, $y_1(n+1)$ is provided as an output of the encoder 44, $y_1(n+2)$ is not provided as an output of the encoder 44, $y_1(n+3)$ is provided as an output of the encoder 44, $y_1(n+4)$ is provided as an output of the encoder 44, $y_1(n+5)$ is not provided as an output of the encoder 44, and so forth as 110 repeats. Likewise, $y_2(n)$ is provided as an output of the encoder 44, $y_2(n+1)$ is not provided as an output of the encoder 44, $y_2(n+3)$ is provided as an output of the encoder 44, and so forth as 101 repeats. Therefore, the encoder 44 provides the same punctured convolutional code at the 3/4 rate as the encoder 10 in a parallel implementation, without bursty data, suitable for high speed digital data processing. The encoder 44 includes the same number of one bit delays as the encoder 10, but includes two more XOR gates. The parallel encoder 44 does not generate bursty data because those bits or bit symbols that are generated, but not transmitted by the 3/4 rate in the known serial convolutional punctured encoding scheme, are not generated by the encoder 44.

Figure 3:
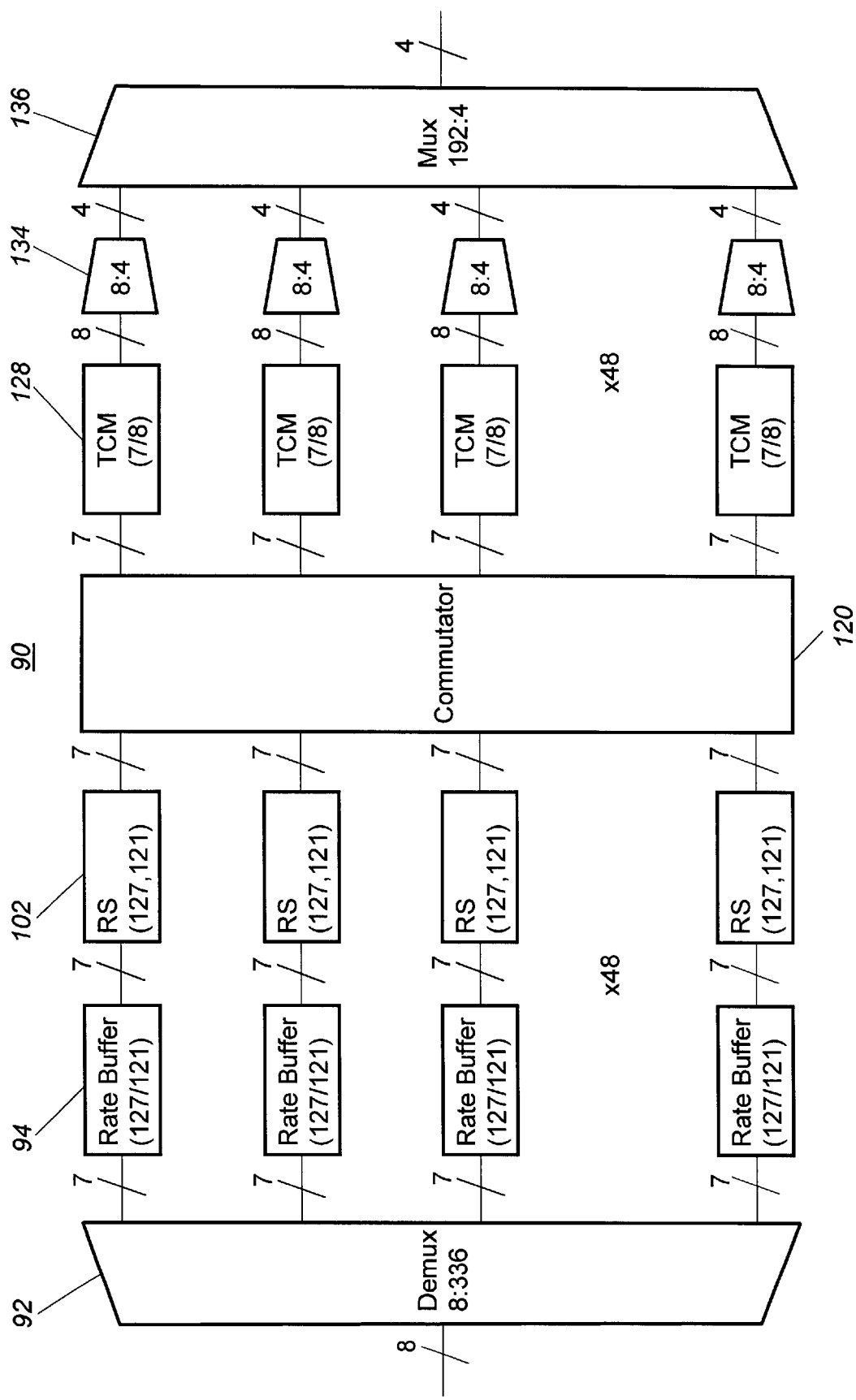
FIG. 3 is a schematic-type diagram of a parallel architecture for a concatenated TCM QAM encoder, according to another an embodiment of the present invention.

FIG. 3 is a schematic type diagram showing the parallel architecture for a concatenated Reed-Solomon (RS) trellis code modulation (TCM) quadrature amplitude modulation (QAM) encoder 90, according to another embodiment of the present invention. The encoder 90 receives a series of parallel input bits, here eight, and outputs four parallel bit symbols for each clock cycle. Suitable serial-to-parallel converters and parallel-to-serial converters would be used to convert digital data streams to parallel data streams and back, as would be apparent to those skilled in the art. The encoder 90 encodes the input bits to provide bit error control.

As will be discussed in detail below, in this particular embodiment, the encoder 90 provides a convolutional coding scheme where the convolutional rate is 7/8, so that eight output bits or bit symbols are provided for each seven input bits. The ratio of output bits to the input bits is 8/7 times 127/121. These values are based on current industry standards for serial TCM QAM encoding. In this example, the clock period for the input bits is 1.2 GHz and the clock period for the output bits is 2.88 GHz, thus providing the convolutional rate discussed above. This coding is for the known 16-ary constellation pattern, which represents four bits. The 16-ary constellation pattern means that the modulation symbol for each codeword has 16 points. That is why the output of the encoder 90 has four parallel output bits in this design.

Figure 4:
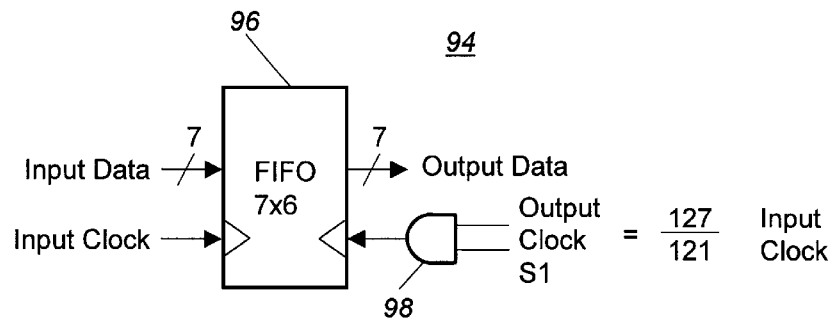
FIG. 4 is a schematic-type diagram of one of the rate buffers used in the encoder shown in FIG. 3.
Figure 5:
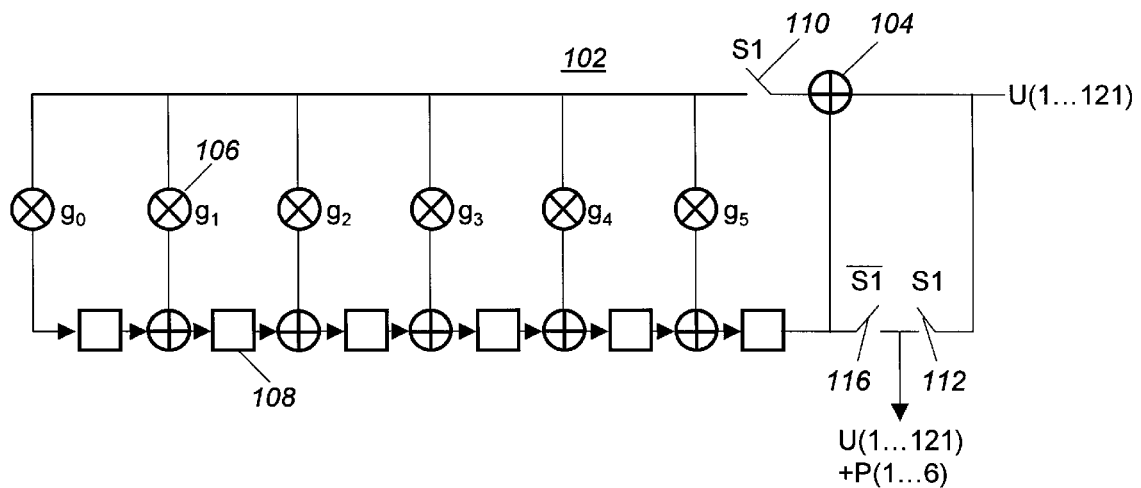
FIG. 5 is a schematic-type diagram of one of the Reed-Solomon encoders used in the encoder shown in FIG. 3.

The eight input bits are applied to an 8:336 demultiplexer 92 that provides an output of 336 parallel bits at a slower clock rate than for the input bits, here 28.57 MHz. The 336 parallel output bits from the demultiplexer 92 are applied to a series of 48 rate buffers 94 in groups of seven bits. FIG. 4 shows a schematic type diagram of one of the rate buffers 94, with the understanding that the other rate buffers 94 operate in the same manner. Each rate buffer 94 takes the input bits at a particular input clock cycle (28.57 MHz), and outputs the data bits in a parallel manner at a faster output clock cycle (30 MHz) so that there are reserved bit slots in each data stream.

The rate buffer 94 includes a 7-bit wide first-in first-out (FIFO) memory element 96 and an AND gate 98. The memory element 96 allows the input data to be written into the element 96 in a continuous manner using the input clock. The output data is read out of the element 96 for the higher frequency output clock gated so that the number of output clock edges equals the number of input clock edges over the inputs. The output clock is determined by 127/121 of the input clock from an output of the AND gate 98. This essentially reserves time slots in the data streams for insertion of data at another time. The AND gate 98 allows the memory element to be gated with a 121/127 duty cycle so that over the long term the number of input clocks equals the number of output clocks. The values 127 and 121 are selected as an industry standard value for this type of encoding. The operation of a rate buffer of this type is well understood to those skilled in the art.

The encoder 44 encodes the data for both an outer code and an inner code. The seven parallel output bit streams from each rate buffer 94, at the output duty clock, are applied to a Reed-Solomon encoders 102, where the Reed-Solomon encoders 102 provide the outer code. Each line in the encoder 102 is seven bits wide. The Reed-Solomon Encoders 102 are well known encoders that take the 121 7-bit symbols and encodes them into a block of 127 7-bit symbols consisting of the 121 input words followed by six 7-bit parity symbols.

Each encoder 102 includes a shift register 100 including a plurality of adders 104, multipliers 106 and one-bit delay devices 108 that provide a long division computation on the bits to generate the polynomial expression $g(x)=x^6+g_5x^5+g_{4x}^4+g_3x^3+g_2x^2+g_1x+g_0$. This expression is used to compute the 7-bit parity symbols in each block of 127 7-bit symbols that fill the extra bit slots generated by the rate buffers 94. The parity bits are those bits that allow the 127 bit symbols received in the decoder to be decoded. Switches 110 and 112 are closed for 121 bits, and are open for the six parity symbols based on the switching time $S_1$. The switching time $S_1$ is the same signal used as one of the inputs to the AND date 98, where it is on for 121 bits and off for the next six bits. Therefore, for the first 121 clock cycles, the input is sent directly to the output.

While the input to the encoder 102 is being sent directly to the output of the encoder 102, the switch 110 is closed so that the shift register 100 is being filled with those data bits. What remains in the shift register 100 after the first 121 clock cycles is shifted for the next six clock cycles through switch 116, and is represented by p(x)=u(x)modg(x). The switch 116 operates at the inverse of $S_1$, in that when the switches 110 and 112 are opened for the six parity bits, the switch 116 is closed. Up to three bits in the Reed-Solomon encoder 102 can be in incorrect, and the decoder 102 will still be able to provide the correct bit pattern. The operation of a Reed-Solomon encoder of this type is well known to those skilled in the art.

Figure 6:
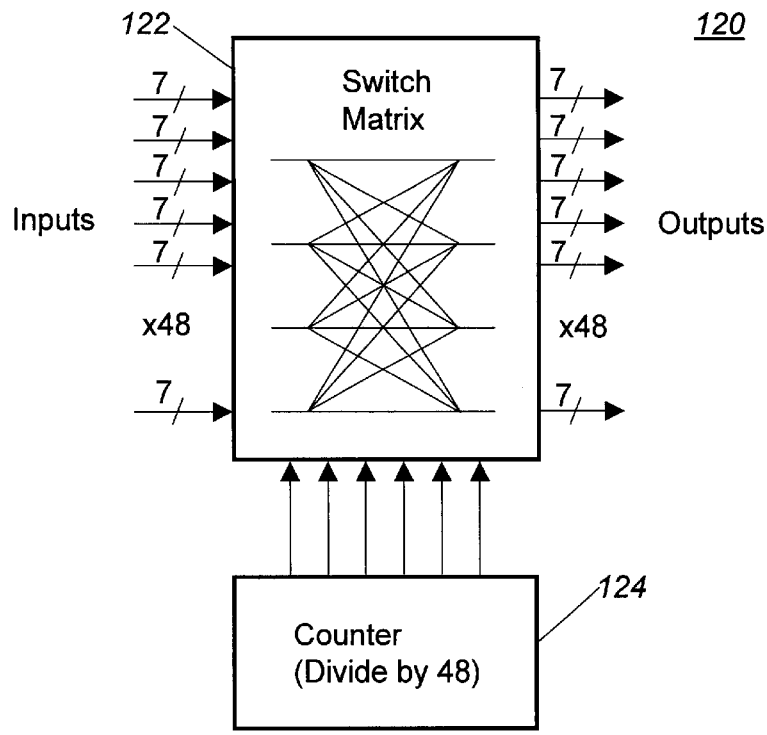
FIG. 6 is a schematic-type diagram of a commutator used in the encoder shown in FIG.3.

It is desirable to spread the errors in the various data streams because they have a tendency to group together, making them more difficult to decode. To provide this function, the 127 bits in each of the seven parallel lines from each Reed-Solomon encoder 102 are sent to a commutator 120, shown in FIG. 6. The commutator 120 includes a switch matrix 122 and a divide by 48 counter 124. The counter 124 provides a calculable way of mixing up the bits in the data streams in the switch matrix 122. The commutator 120 maps 48 7-bit input symbols into 48 7-bit output symbols in a periodic scheme so that for any given period of 48 consecutive inputs, each of the 48 input symbols get mapped only once to each of the 48 output symbols. The operation of a combination of a switch matrix and counter for this purpose is also well understood to those skilled in the art.

Figure 7:
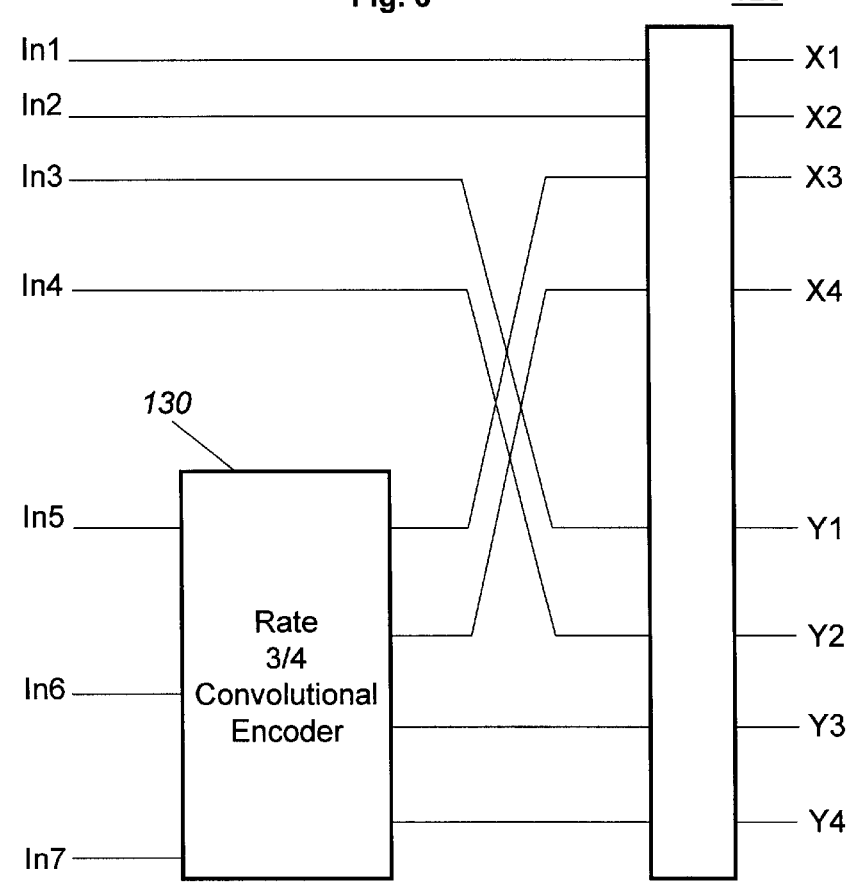
FIG. 7 is a schematic-type diagram of one of the trellis code modulators used in the encoder in FIG. 3.

The commutated digital bits are applied to a series of 48 trellis code modulators (TCMs) 128, one of which is depicted in FIG. 7. The TCM 128 is a 7/8 encoder that provides the inner code for the encoder 90. The encoder 128 maps a 7-bit input symbol into two 4-bit output symbols using a rate 3/4 convolutional encoder 130, where the 4-bit symbols consist of two uncoded bits and two coded bits. This allows the mapping of a 16-ary constellation symbol, such as a 16 QAM, 16 PSK or 16 PAM, into four subsets for set partitioning in a trellis coded modulation transmission scheme. The seven input bits are separated into groups of bits that are not coded and bits that are convolutionally coded. Each bit symbol generated by the TCM 128 is one of the bit symbols mapped into the 16-ary bit pattern representing the four bits. The first four input bits are not coded and the last three input bits are applied to the rate 3/4 convolutional encoder 130. In this design, the most significant bits (MSB) are the ones that are not encoded by the encoder 130 and the least significant bits (LSB) are the ones that are encoded by the encoder 130. The convolutional encoder 130 provides a convolutional code to the last three bits that converts these bits into four output bits. The encoder 130 can be the parallel encoder 44 discussed above, or another parallel convolutional encoder suitable for the purposes described herein.

The output bits from the TCM 128 are separated into two bit symbols for each clock cycle, X1–X4 and Y1–Y4. The input bits 1 and 2 are converted to the bits X1 and X2 and the input bits 3 and 4 are converted to the bits Y1 and Y2. Two of the bits from the encoder 130 are mapped into the first bit symbol as bits X3 and X4, and the other two bits from the encoder 130 are mapped into the second bit symbol as bits Y3 and Y4. Therefore, in this design, the number of outputs from the TCM 128 needs to be a multiple of four. Because X3, X4, Y3 and Y4 are encoded by the encoder 130, the decoder in the receiver is able to determine the proper bit sequence if an invalid bit sequence is received. By only encoding the MSB, a reduction in hardware can be realized without sacrificing bit error control.

The eight bits from the encoders 128 are applied to an 8:4 multiplexer 134. The clock rate of the bits from the TCMs 128 is 30 MHz in this example, and the clock rate of the bits in the four parallel streams from the multiplexers 134 is 60 MHz. The four parallel data streams from the 48 multiplexers 134 are then applied to a 192:4 multiplexer 136 that outputs four streams of digital data at a clock rate of 2.88 GHz. Therefore, the trellis modulation coding is performed in a parallel manner for high clock rates and frequencies.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A punctured convolutional encoder for encoding a stream of digital data bits, said encoder comprising:
   a plurality of digital delay devices, three of the delay devices receiving three consecutive bits in the stream in a parallel manner for each clock period, said plurality of delay devices providing at least six delayed bits relative to a current bit; and
   a plurality of digital gates each receiving a certain number of the digital bits from the delay devices, each gate outputting a bit symbol representative of the bits in a parallel manner.

2. The encoder according to claim 1 wherein the digital gates are exclusive-OR gates, each exclusive-OR gate receiving five of the digital bits at each clock period.

3. The encoder according to claim 1 wherein the bit symbols are polynomial expressions.

4. The encoder according to claim 1 wherein the encoder has a puncture pattern $u_1=110$ for one polynomial expression and $u_2=101$ for another polynomial expression, and has a 3/4 convolutional rate.

5. The encoder according to claim 3 wherein a first digital gate outputs the polynomial expression $y_1(n)=x(n)+x(n-1)+x(n-2)+x(n-3)+x(n-6)$; a second digital gate outputs the polynomial expression $y_2(n)=x(n)+x(n-2)+x(n-3)+x(n-5)+x(n-6)$; a third digital gate outputs the polynomial expression $y_1(n)=x(n)+x(n+1)+x(n-1)+x(n-2)+x(n-5)$; and a fourth digital gate outputs the polynomial expression $y_2(n)=x(n)+x(n-1)+x(n-2)+x(n-3)+x(n-6)$, where n is the current bit.

6. The encoder according to claim 1 wherein n represents the current bit, and wherein a first gate receives the bits n, n−1, n−2, n−3 and n−6, a second gate receives the bits n, n−2, n−3, n−5 and n−6, a third gate receives the bits n+1, n, n−1, n−2 and n−5, and a fourth gate receives the bits n+2, n, n−1, n−3 and n−4.

7. A punctured convolutional encoder for encoding a stream of digital data bits, said encoder comprising:
   six digital delay devices, three of the delay devices receiving three consecutive bits in the stream in a parallel manner for each clock period, said plurality of delay devices providing six delayed bits relative to a current bit; and
   four digital gates each receiving five of the digital bits from the delay devices, each gate outputting a polynomial expression in a parallel manner where each polynomial expression is a bit symbol, wherein a first digital gate outputs the polynomial expression $y_1(n)=x(n)+x(n-1)+x(n-2)+x(n-3)+x(n-6)$; a second digital gate outputs the polynomial expression $y_2(n)=x(n)+x(n-2)+x(n-3)+x(n-5)+x(n-6)$; a third digital gate outputs the polynomial expression $y_1(n)=x(n)+x(n+1)+x(n-1)+x(n-2)+x(n-5)$; and a fourth digital gate outputs the polynomial expression $y_2(n)=x(n)+x(n-1)+x(n-2)+x(n-3)+x(n-6)$, where n is the current bit.

8. The encoder according to claim 7 wherein the encoder has a puncture pattern $u_1=110$ for one polynomial expression and $u_2=101$ for another polynomial expression, and has a 3/4 convolutional rate.

9. The encoder according to claim 7 wherein the digital gates are exclusive-OR gates, each exclusive-OR gate receiving five of the digital bits.

10. A method of convolutionally encoding a digital data stream including digital data, said method comprising the steps of:
    providing three consecutive bits in a parallel manner for each clock period;
    delaying the parallel bits in two successive steps;
    applying the delayed bits to a plurality of digital logic gates; and
    generating bit symbols representing the stream of digital data.

11. The method according to claim 10 wherein the step of generating the bit symbols includes generating polynomial expressions.

12. The method according to claim 11 wherein the step of generating the polynomial expressions includes generating the polynomial expressions $y_1(n)=x(n)+x(n-)+x(n-2)+x(n-3)+x(n-6)$; $y_2(n)=x(n)+x(n-2)+x(n-3)+x(n-5)+x(n-6)$; $y_1(n)\ x(n)+x(n+1)+x(n-1)+x(n-2)+x(n-5)$; and $y_2(n)=x(n)+x(n-1)+x(n-2)+x(n-3)+x(n-6)$, where n is a current bit.

13. The method according to claim 10 wherein the step of applying the delayed bits to a plurality of digital lodging gates includes applying the delayed bits to a plurality of XOR gates where each XOR gate receives five delayed bits.

14. An encoder for encoding a stream of digital data bits, said encoder comprising:
    a demultiplexer responsive to a plurality of parallel input lines of the digital data at a first clock rate, said demultiplexer demultiplexing the input parallel lines of data into more parallel lines of digital data at a second clock rate, wherein the second clock rate is slower than the first clock rate;
    a plurality of outer code devices, each outer code device receiving a predetermined number of the parallel lines of digital data from the demultiplexer, said outer code device generating a plurality of parallel lines of digital data, where each line of data includes a plurality of parity bits, wherein the number of parity bits is determined by an outer code ratio;
    a plurality of inner code devices receiving the plurality of parallel lines of digital data from the outer code devices, said inner code device generating a plurality of bit symbols based on an inner code ratio; and
    a multiplexer responsive to the plurality of parallel lines of digital data from the inner code devices, said multiplexer multiplexing the lines of digital data into a number of parallel lines of digital data at a third clock rate, said third clock rate being determined by the first clock rate and the inner and outer code ratios.

15. The encoder according to claim 14 further comprising a plurality of rate buffers, each of the rate buffers receiving the parallel lines of digital data from the demultiplexer and generating parallel lines of digital data at a fourth clock rate determined by the outer code ratio, wherein the fourth clock rate is faster than the second clock rate and slower than the first clock rate, and wherein the parallel lines of digital data from the rate buffers include reserved bit slots, said outer code device putting the parity bits in the reserved bit slots.

16. The encoder according to claim 14 wherein the plurality of outer code devices are Reed-Solomon encoders.

17. The encoder according to claim 14 wherein the plurality of inner code devices are trellis code modulator encoders.

18. The encoder according to claim 14 wherein each inner code device maps a 7-bit input symbol into two 4-bit output symbols using a 3/4 convolutional rate, where the 4-bit symbols consist of two uncoded bits and two coded bits.

19. The encoder according to claim 18 wherein each inner code device includes a parallel convolutional code modulator that generates the coded bits in each 4-bit symbol.

20. The encoder according to claim 14 further comprising a commutator that maps input bit symbols into output symbols in a periodic manner, said commutator receiving the input bit symbols from the outer code devices and outputting the commutated bit symbols to the inner code devices.

21. The encoder according to claim 14 wherein the encoder is a concatenated Reed-Solomon trellis code modulator quadrature amplitude modulator encoder.

22. An encoder for encoding a stream of digital data bits, said encoder comprising:
- a demultiplexer responsive to a plurality of parallel lines of digital data at a first clock rate, said demultiplexer demultiplexing the input parallel lines of data into more parallel lines of digital data at a second clock rate, wherein the second clock rate is slower than the first clock rate;
- a plurality of rate buffers, each of the rate buffers receiving the parallel lines of digital data from the demultiplexer and generating parallel lines of digital data at a third clock rate where the third clock rate is faster than the second clock rate and slower than the first clock rate, said rate buffers generating parallel lines of digital data that include reserved bit slots based on an outer code ratio;
- a plurality of Reed-Solomon devices, each Reed-Solomon device receiving a predetermined number of the parallel lines of digital data from a rate buffer, said Reed-Solomon devices generating a plurality of parallel lines of digital data, each Reed-Solomon device inputting parity bits in the reserved bit slots in each line of data
- a commutator responsive to the parallel lines of digital data from the Reed-Solomon devices, said commutation rearranging the bits and lines of digital data to separate bit errors and outputting parallel lines of digital data;
- a plurality of trellis code modulators receiving the plurality of parallel lines of digital data from the commutator, said trellis code modulators generating a plurality of bit symbols based on an inner code ratio, each trellis code modulator including a parallel convolutional code modulator that generates bit symbols at a convolutional rate; and
- a multiplexer responsive to the plurality of parallel lines of digital data from the trellis code modulators, said multiplexer multiplexing the lines of digital data into a fewer number of parallel lines of digital data at a fourth clock rate, said fourth clock rate being determined by the first clock rate and the inner and outer code ratios.

23. The encoder according to claim 22 wherein each trellis code modulator maps a 7-bit input symbol into two 4-bit output symbols where the 4-bit symbols consist of two unencoded bits and two coded bits.

24. The encoder according to claim 22 wherein the encoder is a concatenated Reed-Solomon trellis code modulator quadrature amplitude modulator encoder for a 16ary system.

* * * * *